United States Patent [19]

Sanders et al.

[11] 3,997,796

[45] Dec. 14, 1976

[54] HIGH SPEED DIVIDE-BY-TWO CIRCUIT

[75] Inventors: David E. Sanders, St. Petersburg;
Ramon P. Chambers, Clearwater;
Robert S. Gordy, Largo, all of Fla.

[73] Assignee: NCR Corporation, Dayton, Ohio

[22] Filed: May 14, 1975

[21] Appl. No.: 577,373

[52] U.S. Cl. .................. 307/220 R; 307/225 R; 328/25; 331/113 R
[51] Int. Cl.$^2$ .................. H03K 21/00
[58] Field of Search .............. 328/25, 30, 39, 136; 307/220, 225 R, 271; 331/113 R

[56] References Cited
UNITED STATES PATENTS

| | | | |
|---|---|---|---|
| 3,222,618 | 12/1965 | Ressler | 331/113 R |
| 3,536,933 | 10/1970 | Sanders | 307/220 |
| 3,819,955 | 6/1974 | Hilbert | 307/225 R |

FOREIGN PATENTS OR APPLICATIONS 1,168,963  10/1969  United Kingdom .............. 307/271

*Primary Examiner*—John Zazworsky
*Assistant Examiner*—Marcus S. Rasco
*Attorney, Agent, or Firm*—J. T. Cavender; Albert L. Sessler, Jr.; Edward Dugas

[57] ABSTRACT

A high speed divide-by-two circuit operable in the 400 to 500 MHz frequency range comprising a pair of transistors having their emitters connected in common to an input circuit and their bases and collectors cross-coupled by a pair of capacitors. The collectors of the transistors are also coupled together by a single inductor.

3 Claims, 2 Drawing Figures

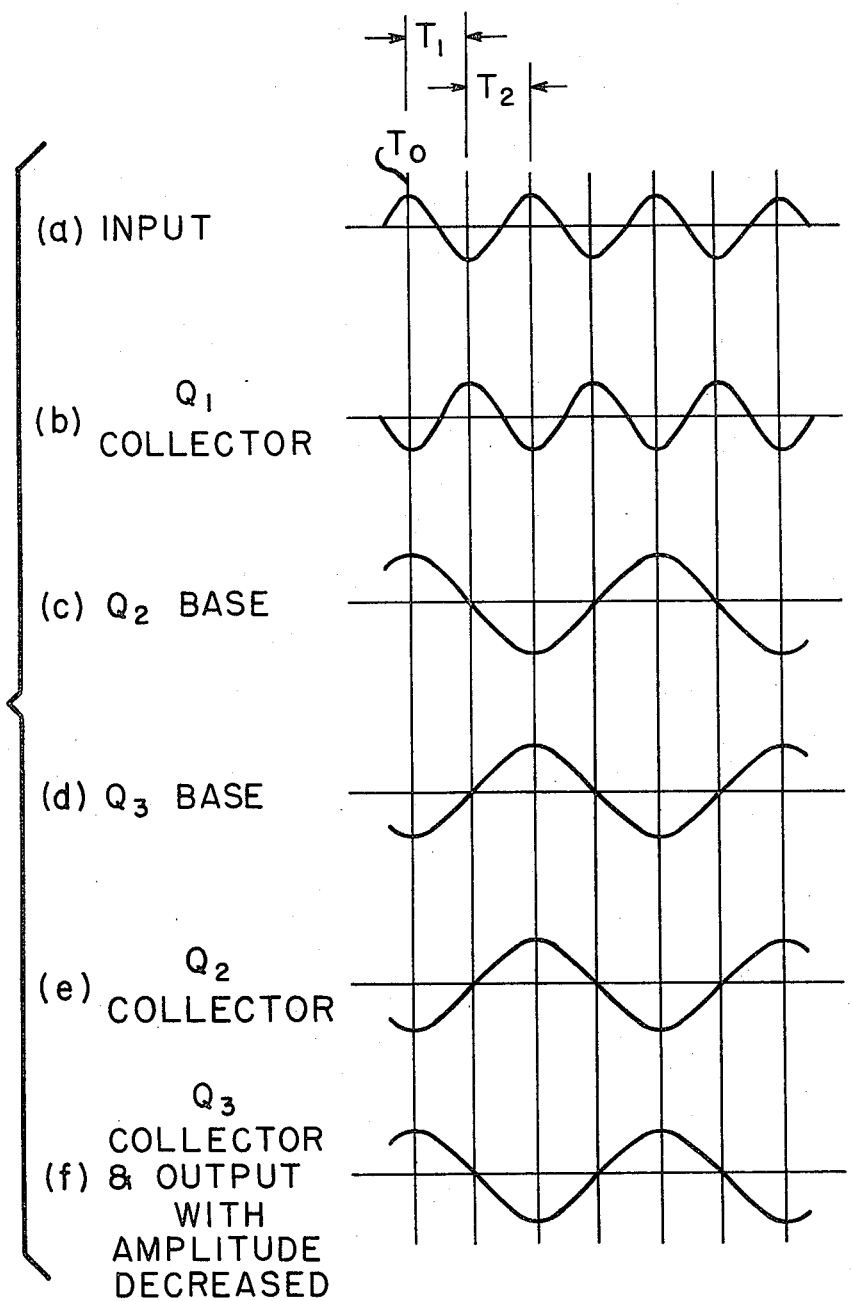

HIGH SPEED DIVIDE-BY-TWO CIRCUIT

BACKGROUND OF THE INVENTION

Conventional circuits, capable of frequency division by two in the UHF band, are either narrow band, or they require specially shaped waveforms at the input. Additionally, these circuits generally constitute a large number of components and dissipate an excessive amount of power.

Typical circuits capable of frequency division below the UHF band include a pair of transistors arranged to divide-by-two in a configuration referred to as current mode flip-flop with emitter triggering. With this arrangement, the bases and collectors of a pair of transistors are cross-coupled first by a pair of capacitors and second through resistors connected to the collectors. As the frequency increases, however, the propagation delay from transistor base to collector becomes significant resulting in an inability of the transistors to follow the input and to divide-by-two.

A circuit for achieving a relatively high frequency divide-by-two action is disclosed in U.S. Pat. No. 3,536,933, entitled "High Speed Divide-By-Two Dual Transistor Circuit", by D.E. Sanders, one of the inventors of the present invention. The circuit disclosed in the aforementioned patent employs a wideband transformer as the collector load of a pair of cross-coupled transistors which are emitter triggered with the input wave to be divided. The wideband transformer enables each transistor to regenerate without waiting for the propagation delay of the other transistor. Although the aforementioned circuit performs well it does not lend itself to efficient miniaturization due to the use of the wideband transformer. In addition higher frequency signals, for example, signals in the 400 to 500 MHz band are not handled efficiently.

The present inventive circuit lends itself readily to miniaturization, operates with higher frequency signals, and uses less power than the prior art circuits.

SUMMARY OF THE INVENTION

The present invention is directed to the field of divide-by-two circuits and more particularly to divide-by-two circuits operable in the frequency range of 400 to 500 MHz.

In the preferred embodiment of the invention there is provided a pair of transistors, each having collector, emitter and base electrodes. An input circuit means is coupled in common to the emitter electrodes of each of the pair of transistors. A pair of capacitors connect the respective collector electrodes of each transistor to the base electrode of the other transistor. A coil is connected between the collector electrodes of the transistors.

In operation, the circuit functions as an astable multivibrator having a free running frequency, determined in the main by the coil, which frequency is set approximately at the center frequency of the output bandwidth. The signal applied to the input circuit means synchronizes the free running state of the circuit such that the output of the circuit is equal to one-half the frequency of the input signal.

From the foregoing it can be seen that it is a primary object of the present invention to provide an improved divide-by-two circuit.

It is a further object of the present invention to provide a novel divide-by-two circuit which is amenable to miniaturization.

It is yet another object of the present invention to provide a high frequency divide-by-two circuit.

It is yet a further object of the present invention to provide a high frequency divide-by-two circuit which utilizes low power levels.

These and further objects of the present invention will become more apparent and better understood when taken in conjunction with the following description and drawings, throughout which like characters indicate like parts, and which drawings form a part of this application.

BRIEF DESCRIPTION OF THE DRAWINGS

FIG. 2 illustrates waveforms occurring at predetermined points in the circuit of FIG. 1.

DETAILED DESCRIPTION OF THE INVENTION

Figure 1:
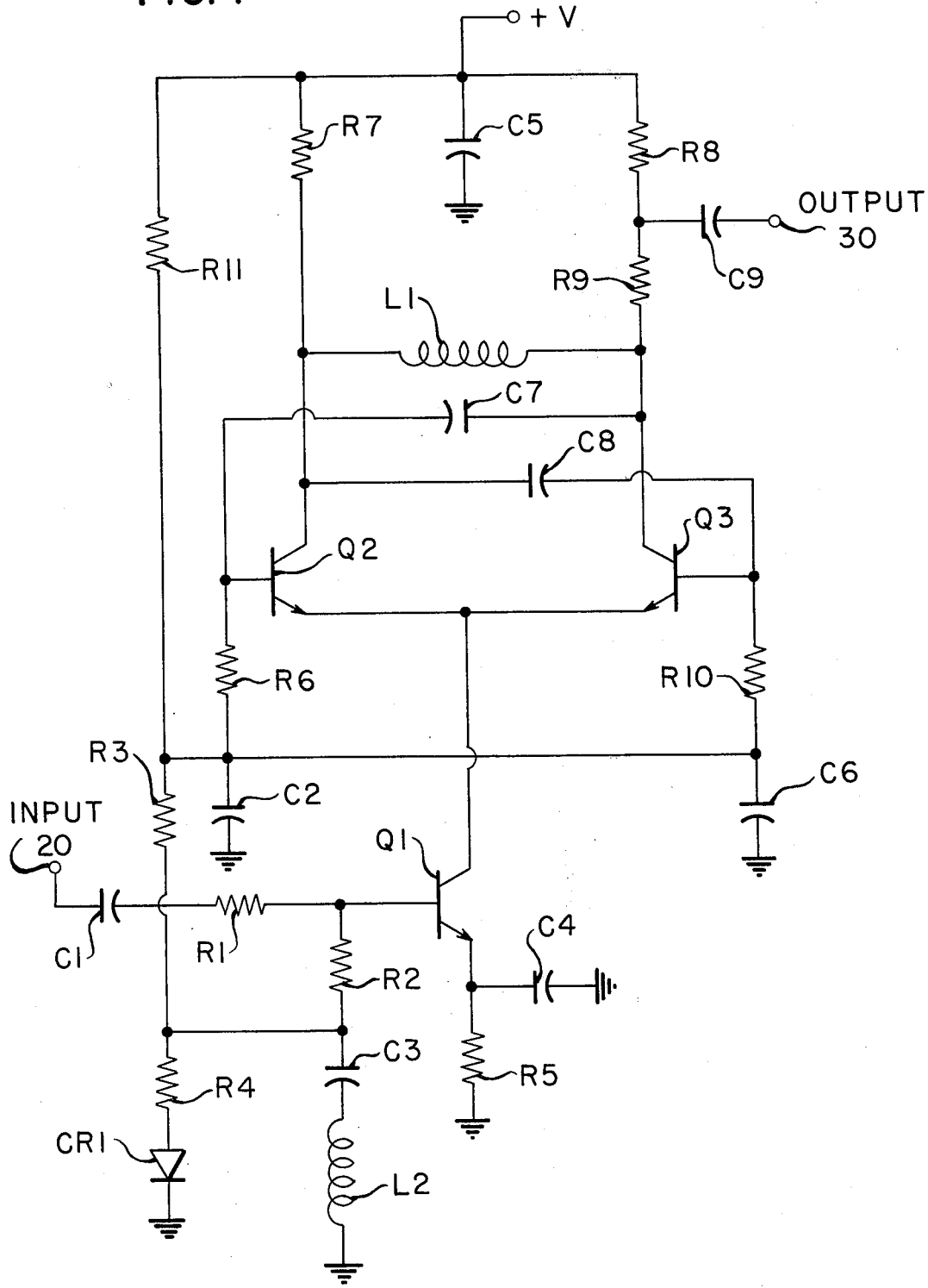
FIG. 1 is a schematic diagram illustration of the UHF divide-by-two circuit of the present invention.

Referring to FIG. 1, the input signal to be divided-by-two is applied to the input terminal 20. The input terminal 20 is coupled to the emitters of NPN transistors $Q_2$ and $Q_3$ via an input circuit means comprised of a current amplifying NPN transistor $Q_1$. The input 20 is coupled to the base of transistor $Q_1$ by the capacitor $C_1$ connected in series with the resistor $R_1$. The collector of transistor $Q_1$ is connected directly to the emitters of transistors $Q_2$ and $Q_3$. The emitter of transistor $Q_1$ is connected to a common reference potential (ground) by means of resistor $R_5$ and capacitor $C_4$. Biasing of transistor $Q_1$ is accomplished through the voltage divider network consisting of resistors $R_3$, $R_4$ and $R_{11}$, along with the diode $CR_1$ which connects the resistor $R_4$ to the common reference potential. The diode $CR_1$ changes resistance with temperature so as to compensate the biasing levels in accordance with temperature changes. A capacitor $C_3$ serially connects one end of the coil $L_2$ to the junction of resistors $R_2$ and $R_4$. The other end of the coil $L_2$ is connected to the common reference potential. Resistor $R_{11}$ connects resistor $R_3$ to a +V voltage supply. The bases of transistors $Q_2$ and $Q_3$ are connected by means of resistors $R_6$ and $R_{10}$, respectively, to the juncture of resistors $R_3$ and $R_{11}$. Capacitors $C_2$ and $C_6$ connect resistors $R_6$ and $R_{10}$ to the reference potential, respectively. The capacitors $C_2$ and $C_6$ are located as close as practically convenient to the bases of transistors $Q_2$ and $Q_3$. The juncture of capacitor $C_6$ and resistor $R_{10}$ is connected to the juncture of capacitor $C_2$ and resistor $R_6$, and to the juncture of resistors $R_3$ and $R_{11}$. Capacitor $C_7$ couples the collector of transistor $Q_3$ to the base of transistor $Q_2$. The capacitor $C_8$ couples the collector of transistor $Q_2$ to the base of transistor $Q_3$. The coil $L_1$ connects the collector of transistor $Q_3$ to the collector of transistor $Q_2$. Resistor $R_7$ connects the collector of transistor $Q_2$ to the +V voltage supply. Resistors $R_8$ and $R_9$ serially connect the collector of transistor $Q_3$ to the +V voltage supply. The juncture of resistors $R_8$ and $R_9$ is connected to the output terminal 30, via a capacitor $C_9$. A capacitor $C_5$ is connected between the +V voltage supply and the reference potential.

The circuit as described is an A.C. coupled astable multivibrator having a currect amplifier which couples the synchronizing input signal to the astable multivibrator's emitter circuit. In operation, the signal at the junction of the two emitters oscillates at twice the frequency of each transistor. The output signal present at terminal 30 will therefore be equal to half the frequency of the signal present at the emitters of $Q_2$ and $Q_3$. The bandwidth over which the multivibrator output frequency can be synchronized to the input signal depends upon the Q of the multivibrator circuit and the level of the signal applied to the input terminal 20. The free running frequency of the circuit is roughly tuned by the inductance of coil $L_1$ to a frequency lying substantially at the center of the output bandwidth. The resistors $R_1$ and $R_2$ and the coil $L_2$ are chosen to match the input impedance of transistor $Q_1$ to the source driving impedance connected to the input terminal 20. The resistors $R_8$ and $R_9$ operate to isolate the output load from the multivibrator while the resistor $R_7$ provides symmetrical loading of the multivibrator circuit.

Referring now to FIG. 2, as has previously been mentioned the circuit has a free running frequency without any signal applied to the input. The inequalities in transistor parameters and circuit component values dictate whether transistor $Q_2$ or transistor $Q_3$ first conducts when the potential +V is applied to the circuit. When an external signal is applied to the input 20, the output frequency and phase are synchronized to the input signal to correspond to the waveforms shown in FIG. 2. The waveform of FIG. 2a is the input waveform applied to terminal 20; the waveform of FIG. 2b is the waveform present at the collector of transistor $Q_1$; the waveform of FIG. 2c is the waveform present at the base of transistor $Q_2$; the waveform of FIG. 2d is the waveform of the signal present at the base of transistor $Q_3$; the waveform of FIG. 2e illustrates the waveform present at the collector of transistor $Q_2$; and the waveform of FIG. 2f illustrates the output waveform, which is also present at the collector of transistor $Q_3$. The amplitudes of the waveforms have been normalized in order to show more clearly their frequency and phase relationships rather than their amplitude relationships. As can be seen by the waveforms of FIG. 2, the transistors are not driven into saturation or cut-off. At the time $T_0$, the transistor $Q_3$ is at its lowest conduction point. The voltage on the base of transistor $Q_3$ is low, therefore, the voltage at the collector of $Q_3$ will be high. The voltage coupled by capacitor $C_7$ to the base of $Q_2$ will follow the voltage on the collector of transistor $Q_3$ and therefore will also be high, forcing transistor $Q_2$ into a high state of conduction. With $Q_2$ in conduction the voltage present on the collector of $Q_2$ will be a minimum. This minimum voltage is coupled to the base of transistor $Q_3$ by means of capacitor $C_8$. As capacitor $C_7$ charges, it is less capable of providing the base current required by transistor $Q_2$; therefore transistor $Q_2$ tends to conduct less which in turn causes the voltage at the collector of $Q_2$ to increase, thereby charging capacitor $C_8$ and causing an increased current to flow in transistor $Q_3$. This transition continues during the time periods $T_1$ and $T_2$ until the condition is reached that $Q_3$ is conducting heavily and $Q_2$ is conducting a minimum. The voltage on the collector of $Q_2$ will then rise to its maximum value. This will continue until the current passing through capacitor $C_8$ decreases to a value which tends to cause transistor $Q_3$ to decrease in conduction. While transistor $Q_3$ was conducting the capacitor $C_7$ was discharging through transistor $Q_3$. As transistor $Q_3$ decreases in conduction, the voltage on the collector of $Q_3$ increases again, commencing to charge capacitor $C_7$ by increasing the conduction of transistor $Q_2$. Thereafter the cycle of free running repeats itself. The signal present at the collector of transistor $Q_1$ sunchronizes the cycling of the transistors $Q_2$ and $Q_3$ by causing the level of the signals present on the emitters of $Q_2$ and $Q_3$ to follow the level of the signal present on the base of transistor $Q_1$.

Parameters of an examplary circuit operable in the 400 to 500 MHz. UHF are given below:

| | |
|---|---|
| $R_1$ | 18 ohms |
| $R_2$ | 39 ohms |
| $R_3$, $R_{11}$ | 3.3 K ohms |
| $R_4$ | 820 ohms |
| $R_5$ | 180 ohms |
| $R_6$, $R_{10}$ | 470 ohms |
| $R_7$ | 120 ohms |
| $R_8$ | 100 ohms |
| $R_9$ | 82 ohms |
| $C_1$ | 150 pf |
| $C_2$, $C_3$, $C_4$, $C_5$, $C_6$ | .001 $\mu$f |
| $C_7$, $C_8$ | 5 pf |
| $C_9$ | 330 pf |
| $CR_1$ | 1 N914 |
| $Q_1$, $Q_2$, $Q_3$ | 2 N2857 |
| $L_1$ Adjusted In Circuit Nominal | .15 $\mu$H |
| $L_2$ | $\approx$ 8NH |
| V | +12V |

While there has been disclosed what is considered to be the preferred embodiment of the invention, it will be manifest that many changes and modifications may be made therein without departing from the essential spirit of the invention. It is intended, therefore, in the annexed claims to cover all such changes and modifications which fall within the true scope of the invention.

What is claimed is:
1. A high speed divide-by-two circuit comprising:
   a pair of transistors, each having collector, emitter and base electrodes;
   an input circuit means coupled in common to the emitter electrodes of each of said transistors;
   a pair of capacitors connecting the respective collector electrode of each transistor to the base electrode of the other transistor;
   a coil connected directly between the collector electrodes of said transistors;
   resistance means for connecting each of said collectors to a potential source;
   biasing means connected to the bases of said transistors for biasing said transistors; and
   an output terminal coupled to the collector electrode of one of said transistors.
2. The high speed divide-by-two circuit according to claim 1 wherein said input circuit means is a current amplifier comprised of:
   a transistor having a collector, emitter and base electrode,
   said collector electrode connected to the emitter electrodes of said pair of transistors, said base electrode coupled to an input, and said emitter electrode connected to a common reference potential.
3. The high speed divide-by-two circuit according to claim 1 and further comprising:
   means for temperature compensating said biasing means.

* * * * *